United States Patent
Kaigawa et al.

(10) Patent No.: US 8,124,047 B2
(45) Date of Patent: Feb. 28, 2012

(54) METHOD FOR MANUFACTURING (LI, NA, K)(NB, TA)$O_3$ TYPE PIEZOELECTRIC MATERIAL

(75) Inventors: Kazuyuki Kaigawa, Nagoya (JP); Shuichi Ozawa, Nagoya (JP); Hirofumi Yamaguchi, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 11/958,636

(22) Filed: Dec. 18, 2007

(65) Prior Publication Data

US 2008/0152581 A1    Jun. 26, 2008

Related U.S. Application Data

(60) Provisional application No. 60/876,619, filed on Dec. 22, 2006.

(30) Foreign Application Priority Data

Oct. 23, 2007   (JP) .................................. 2007-274763

(51) Int. Cl.
   *C01G 33/00*   (2006.01)
   *C04B 35/468*  (2006.01)
(52) U.S. Cl. ..................................... 423/594.8; 501/134
(58) Field of Classification Search ............... 423/594.8; 501/134; *C01G 31/02, 33/00; C04B 35/638*
   See application file for complete search history.

(56) References Cited

U.S. PATENT DOCUMENTS

| | | | |
|---|---|---|---|
| 6,051,171 A | | 4/2000 | Takeuchi et al. |
| 2002/0123421 A1* | | 9/2002 | Cheong et al. ................ 501/134 |
| 2003/0151331 A1* | | 8/2003 | Akimune et al. ............. 310/358 |
| 2006/0006360 A1* | | 1/2006 | Takao et al. ............. 252/62.9 R |
| 2006/0066176 A1 | | 3/2006 | Nanataki et al. |
| 2006/0100087 A1 | | 5/2006 | Fukuta et al. |
| 2006/0202170 A1 | | 9/2006 | Koizumi et al. |
| 2008/0095927 A1 | | 4/2008 | Nanataki et al. |

FOREIGN PATENT DOCUMENTS

| | | |
|---|---|---|
| EP | 0 384 465 A1 | 8/1990 |
| EP | 0 441 640 A2 | 8/1991 |
| EP | 0 959 056 A1 | 11/1999 |
| EP | 1 028 098 A2 | 8/2000 |
| JP | 2003-327472 * | 11/2003 |
| JP | 2006-028001 | 2/2006 |
| WO | 2006/035723 | 4/2006 |
| WO | 2006/095716 | 9/2006 |

OTHER PUBLICATIONS

Matsubara et al., "Effect of Li Substitution on the Piezoelectric Properties of Potassium Sodium Niobate Ceramics" Japanese Journal of Applied Physics. vol. 44, No. 8, 2005, pp. 6136-6142.

(Continued)

*Primary Examiner* — Jessica L Ward
*Assistant Examiner* — Alexander Polyansky
(74) *Attorney, Agent, or Firm* — Burr & Brown

(57) ABSTRACT

A method for manufacturing (Li, Na, K)(Nb, Ta)$O_3$ type piezoelectric material having an improved relative dielectric constant and an electric-field-induced strain is provided. The method is a process in which a formed body of powder particles constituted of a composition of (Li, Na, K)(Nb, Ta)$O_3$ is fired to produce the (Li, Na, K)(Nb, Ta)$O_3$ type piezoelectric material, and a constant temperature is kept in a range of 850 to 1000° C. for a constant time before heating to a firing temperature.

7 Claims, 2 Drawing Sheets

OTHER PUBLICATIONS

Hollenstein et al., "Piezoelectric Properties of Li- and Ta-modified $(K_{0.5}Na_{0.5})NbO_3$ Ceramics", Applied Physics Letters 87, 182905 (2005).

Guo et al., "Phase Transitional Behavior and Piezoelectric Properties of $(Na_{0.5}K_{0.5})NbO_3$-$LiNbO_3$ Ceramics". Applied Physics Letters, vol. 85, No. 18, Nov. 1, 2004, pp. 4121-4123.

* cited by examiner

METHOD FOR MANUFACTURING (LI, NA, K)(NB, TA)O$_3$ TYPE PIEZOELECTRIC MATERIAL

BACKGROUND OF THE INVENTION

1. Field of the Invention

The present invention relates to a method for manufacturing (Li, Na, K)(Nb, Ta)O$_3$ type piezoelectric material for use in an actuator and a sensor.

2. Description of the Related Art

A piezoelectric/electrostrictive actuator has an advantage in that displacement can precisely be controlled on the order of submicrons. Especially, in the piezoelectric/electrostrictive actuator in which a sintered body of a piezoelectric/electrostrictive porcelain composition is used as a piezoelectric/electrostrictive body, there are also other advantages in that the actuator has a high electromechanical change efficiency, a large generative force, a high responsivity, high durability and a small power consumption, and an actuator using these advantages is employed in a head of an ink jet printer, an injector of a diesel engine or the like.

As the piezoelectric/electrostrictive porcelain composition for the piezoelectric/electrostrictive actuator, heretofore, a Pb(Zr, Ti)O$_3$ (PZT)-type piezoelectric/electrostrictive porcelain composition has been used, but there has been a strong fear of an influence of solute of lead from the sintered body on global environments, and hence a (Li, Na, K)(Nb, Ta)O$_3$ type piezoelectric/electrostrictive porcelain composition has been investigated.

The (Li, Na, K)(Nb, Ta)O$_3$ type piezoelectric material is usually sintered in the air or in an oxygen atmosphere at 1020 to 1250° C. for 0.15 to 4 hours (for example, Non-Patent Documents 1 to 3). The heating rate to reach the firing temperature is 200° C./h or 300° C./h, and the temperature rises at a constant heating rate from room temperature to the firing temperature (for example, Patent Document 1). There is also a research example in which the temperature is kept in a range of 600 to 650° C. for 1 to 5 hours in the heating process, whereby an organic binder added to improve formability of powder is removed (a de-binder process) (for example, Patent Document 1).

[Non-Patent Document 1] M. Matsubara et. al., Jpn. J. Appl. Phys. 44 (2005) pp. 6136-6142;

[Non-Patent Document 2] E. Hollenstein et. al., Appl. Phys. Lett. 87 (2005) 182905;

[Non-Patent Document 3] Y. Guo et. al., App. Phys. Lett. 85 (2004) 4121; and

[Patent Document 1] JP-A-2006-28001.

However, in the above prior art, the firing temperature and the de-binder are investigated, but the holding process at a temperature close to the firing temperature and the heating rate are not disclosed.

Moreover, the above prior art have the following problems.

(1) There are a large number of pores (grain boundaries, intragranular) in the sintered body, and the degree of densification is insufficient (a relative density of 90 to 95%, for example in Non-Patent Document 2, relative density is 94% when K=Na=0.48, Li=0.04, Nb=0.9 and Ta=0.1, a).

(2) Since the degree of densification is low, there is a possibility that original properties of the material are not utilized.

(3) Since the degree of densification is low, the mechanical strength is insufficient.

(4) There is a research example (for example, Non-Patent Document 1) in which an additive (a sintering aid) such as Cu or Mn is added to raise the degree of densification, but the additive element is dissolved in the (Li, Na, K)(Nb, Ta)O$_3$ type piezoelectric material, and there is the possibility that the original properties are changed.

(5) Since the additive element is added, the composition to be controlled increases.

SUMMARY OF THE INVENTION

The present invention has been developed in view of such problems of the conventional technologies, and an object thereof is to provide a method for manufacturing a (Li, Na, K)(Nb, Ta)O$_3$ type piezoelectric material in which the relative dielectric constant and an electric-field-induced strain can be improved.

The present inventor has aimed at improving properties by changing the firing schedule to raise the degree of densification, instead of adding a sintering aid such as an additive element. Specifically, first a firing contraction curve from a formed body of (Li, Na, K)(Nb, Ta)O$_3$ to a sintered body has been measured to investigate a temperature range in which the firing contraction occurs. As a result, it has been found that by using a process of holding a constant temperature in the temperature range in which the firing contraction occurs during the firing schedule, the sintered body (a piezoelectric material) having an excellent degree of densification and having a highly electric-field-induced strain is obtained.

According to the present invention, there is provided a method for manufacturing a (Li, Na, K)(Nb, Ta)O$_3$ type piezoelectric material in which a formed body of powder particles constituted of a composition of (Li, Na, K)(Nb, Ta)O$_3$ is fired to produce the (Li, Na, K)(Nb, Ta)O$_3$ type piezoelectric material, wherein a constant temperature is kept in a range of 850 to 1000° C. for a constant time.

In the manufacturing method of the present invention, it is preferable that the range of the holding temperature is 850 to 950° C., and it is preferable that the holding time is 1 to 20 hours. It is also preferable that the firing atmosphere is an oxygen atmosphere.

It is to be noted that it is preferable that the (Li, Na, K)(Nb, Ta)O$_3$ type piezoelectric material has a composition represented by the following general formula (1):

$$\{Li_y(Na_{1-x}K_x)_{1-y}\}_a(Nb_{1-z}Ta_z)O_3 \qquad (1),$$ 

in which a=0.90 to 1.2, x=0.2 to 0.8, y=0.02 to 0.2 and z=0.05 to 0.5.

The method for manufacturing the (Li, Na, K)(Nb, Ta)O$_3$ type piezoelectric material according to the present invention involves the process of holding a temperature immediately before grain growth occurs or a temperature at which a slight other phase exists is added to a heating process to a firing temperature, thus an effect that the improvement of the degree of densification is achieved without using any sintering aid, to obtain a highly electric-field-induced strain. Moreover, since this process is added, there is also a functional effect in that crystal grain diameters become more uniform, and the highly electric-field-induced strain can be obtained. The effect of the present invention does not depend on the sintering method. That is, the present invention is effective with respect to a sintering method that does not include pressurizing, and also with respect to a sintering method [for example, hot press (HP) or hot isostatic press (HIP)] including a pressurizing mechanism. The effect of the present invention does not depend on any atmosphere. That is, the present invention is effective even in the air, an oxygen atmosphere or a reducing atmosphere such as an Ar or N$_2$ atmosphere.

DETAILED DESCRIPTION OF THE INVENTION

Figure 1:
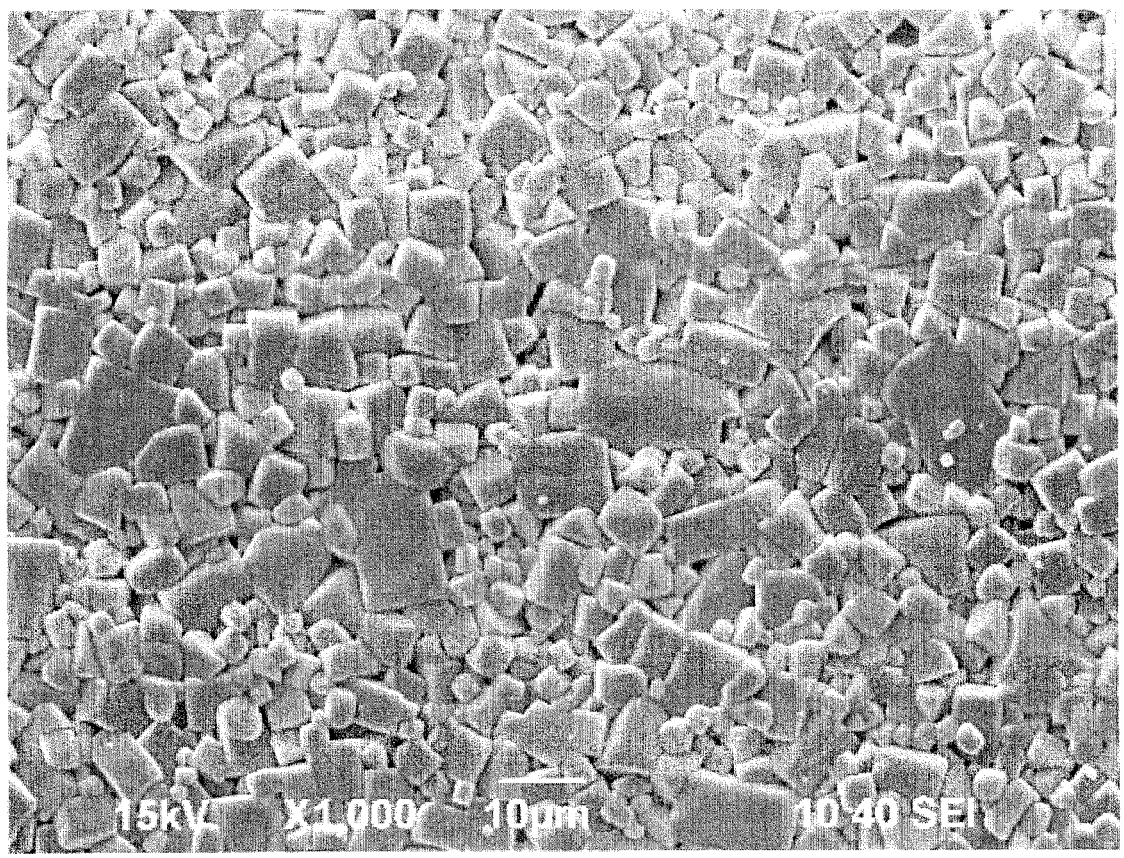
FIG. 1 is an SEM photograph showing a surface microstructure of a sintered body obtained in Comparative Example 1.

The best mode for carrying out the present invention will hereinafter be described, but it should be understood that the present invention is not limited to the following embodiment and that appropriate modification, improvement and the like added to the following embodiment based on ordinary knowledge of a person skilled in the art without departing from the scope of the present invention fall in the scope of the present invention.

A manufacturing method of the present invention has a characteristic that when a formed body of powder particles having a composition of (Li, Na, K)(Nb, Ta)O₃ is fired, a constant temperature is held in a range of 850 to 1000° C., preferably 850 to 950° C. for a constant time. The range of 850 to 1000° C. is a temperature immediately before grain growth of the powder particles occurs or a temperature at which a slight other phase exists, and by holding the constant temperature in this temperature range for the constant time, the degree of densification of the resultant sintered body improves without using any sintering aid and a highly electric-field-induced strain is obtained.

When the holding temperature is lower than 850° C., the degree of densification of the resultant sintered body does not improve very much, and the electric-field-induced strain decreases. On the other hand, when the holding temperature exceeds 1000° C., the temperature comes excessively close to the firing temperature of 1050° C., which means that sintering is practically performed, and the holding process becomes insignificant.

Moreover, the time for holding the constant temperature in the range of 850 to 1000° C. is preferably 1 to 20 hours. When the holding time is shorter than 1 hour, an effect is low, the degree of densification of the resultant sintered body does not improve, and the electric-field-induced strain is also low. On the other hand, when the holding time exceeds 20 hours, properties do not improve any more.

In the firing schedule of the present invention, an oxygen atmosphere is preferable, but the present invention is not limited to this atmosphere. That is, the present invention has a predetermined effect even in a reducing atmosphere such as an Ar or N₂ atmosphere, not limited to the air or the oxygen atmosphere.

Furthermore, the manufacturing method of the present invention does not depend on any sintering technique. That is, the present invention similarly produces an effect in not only a sintering method that does not include pressurizing but also a sintering method including a pressurizing mechanism [for example, hot press (HP) or hot isostatic press (HIP)].

As an (Li, Na, K)(Nb, Ta)O₃ type piezoelectric material for use in the present invention, a material having a composition represented by the following general formula (I) is preferable:

$$\{Li_y(Na_{1-x}K_x)_{1-y}\}_a(Nb_{1-z}Ta_z)O_3 \quad (1),$$

in which a=0.90 to 1.2, x=0.2 to 0.8, y=0.02 to 0.2 and z=0.05 to 0.5.

In the present invention, a piezoelectric material including an oxide made of Li, Na, K, Nb and Ta is applicable. In the material, it is preferable in the general formula (I) that a=0.90 to 1.2, x=0.2 to 0.8, y=0.02 to 0.2 and z=0.05 to 0.5. It is further preferable that a=1.005 to 1.10, x=0.4 to 0.6, y=0.05 to 0.1 and z=0.08 to 0.25.

Here, with regard to an A/B ratio (=a), a≦1.2 is preferred. This is because when this range is exceeded, dielectric loss increases, and the electric-field-induced strain during the application of a high electric field tends to decrease. The increase of the dielectric loss raises a large problem in a piezoelectric/electrostrictive porcelain composition for an actuator to which the high electric field is applied. On the other hand, a value of 0.90≦a is set to promote the grain growth and densify the material. When the ratio is below this range, heating at 1100° C. or more is required to promote the grain growth. In this case, evaporation of alkali components easily occurs, the composition fluctuates, and thus the properties become unstable. In the present invention, it is especially preferable to set 1.005≦a≦1.10. In this case, the densification and the grain growth are effectively performed, the firing temperature can be set to 1100° C. or less, and the fluctuation of the composition can be avoided.

Moreover, K, Li and Ta amounts are set to 0.2≦x≦0.8, 0.02≦y≦0.2 and 0.05≦z≦0.5, respectively. This is because the piezoelectric/electrostrictive porcelain composition suitable for the actuator can be obtained in this range.

For example, when x is below this range, piezoelectric/electrostrictive properties rapidly deteriorate. On the other hand, when x exceeds this range, it becomes difficult to perform the sintering, and the firing temperature has to be raised. It is not preferable to raise the firing temperature, because when the firing temperature is raised, the alkali components contained in the piezoelectric/electrostrictive porcelain composition evaporate, and the piezoelectric/electrostrictive properties cannot stably be obtained.

Moreover, when y is below this range, it also becomes difficult to perform the sintering, and the firing temperature has to be raised. On the other hand, the amount of the other phase increases, while an insulating property is deteriorated when y exceeds this range.

Furthermore, when z is below this range, the piezoelectric/electrostrictive properties deteriorate. On the other hand, when z exceeds this range, it also becomes difficult to perform the sintering, and the firing temperature has to be raised.

EXAMPLES

Next, examples as specific implementation results of the present invention and comparative examples will be described.

Comparative Example 1

Calcined/crushed powder (grain diameters of 0.2 to 0.5 μm, a grain shape was spherical) having a composition of  $\{Li_y(Na_{1-x}K_x)_{1-y}\}_a(Nb_{1-z}Ta_z)O_3$ (x=0.458, y=0.057, z=0.082, a=1.01) was formed into pellets (a pellet-like sample). This pellet-like sample was heated in a furnace at a heating rate of 200° C./h to a firing temperature of 1050° C. in the air. After retaining the temperature in the furnace at 1050° C. for 3 hours, the sample was cooled in the furnace. With regard to the resultant sintered body, the bulk density was measured by the Archimedean method. It is also observed from a surface microstructure of the resultant sintered body that the grain diameters largely fluctuate and are non-uniform (see an SEM photograph of FIG. 1). After machining this sintered body into strips, the relative dielectric constant, the piezoelectric constant $d_{31}$, the dielectric loss (tan δ) and the electric-field-induced strain S4000 (strain in 31 directions, that is, directions vertical to an electric field applying direction at a time when an electric field of 4 kV/mm was applied) were evaluated. The results are shown in Tables 1 and 2.

Comparative Example 2

After the pellet-like sample described in Comparative Example 1 was heated in a furnace at a heating rate of 200° C./h to 800° C. in air and retained at 800° C. for 3 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 1.

Example 1

After the pellet-like sample described in Comparative Example 1 was heated in a furnace at a heating rate of 200° C./h to 850° C. in the air and retained at 850° C. for 3 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 1.

Example 2

After the pellet-like sample described in Comparative Example 1 was heated in a furnace at a heating rate of 200° C./h to 900° C. in the air and retained at 900° C. for 3 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Tables 1 and 2.

Example 3

After the pellet-like sample described in Comparative Example 1 was heated in a furnace at a heating rate of 200° C./h to 950° C. in the air and retained at 950° C. for 3 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 1.

Example 4

After the pellet-like sample described in Comparative Example 1 was heated in a furnace at a heating rate of 200° C./h to 1000° C. in the air and retained at 1000° C. for 3 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 1.

Example 5

After the pellet-like sample described in Comparative Example 1 was heated in a furnace at a heating rate of 200° C./h to 900° C. in the air and retained at 900° C. for 1 hour, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 2.

Example 6

After the pellet-like sample described in Comparative Example 1 was heated in a furnace at a heating rate of 200° C./h to 900° C. in the air and retained at 900° C. for 6 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 2.

Example 7

Figure 2:
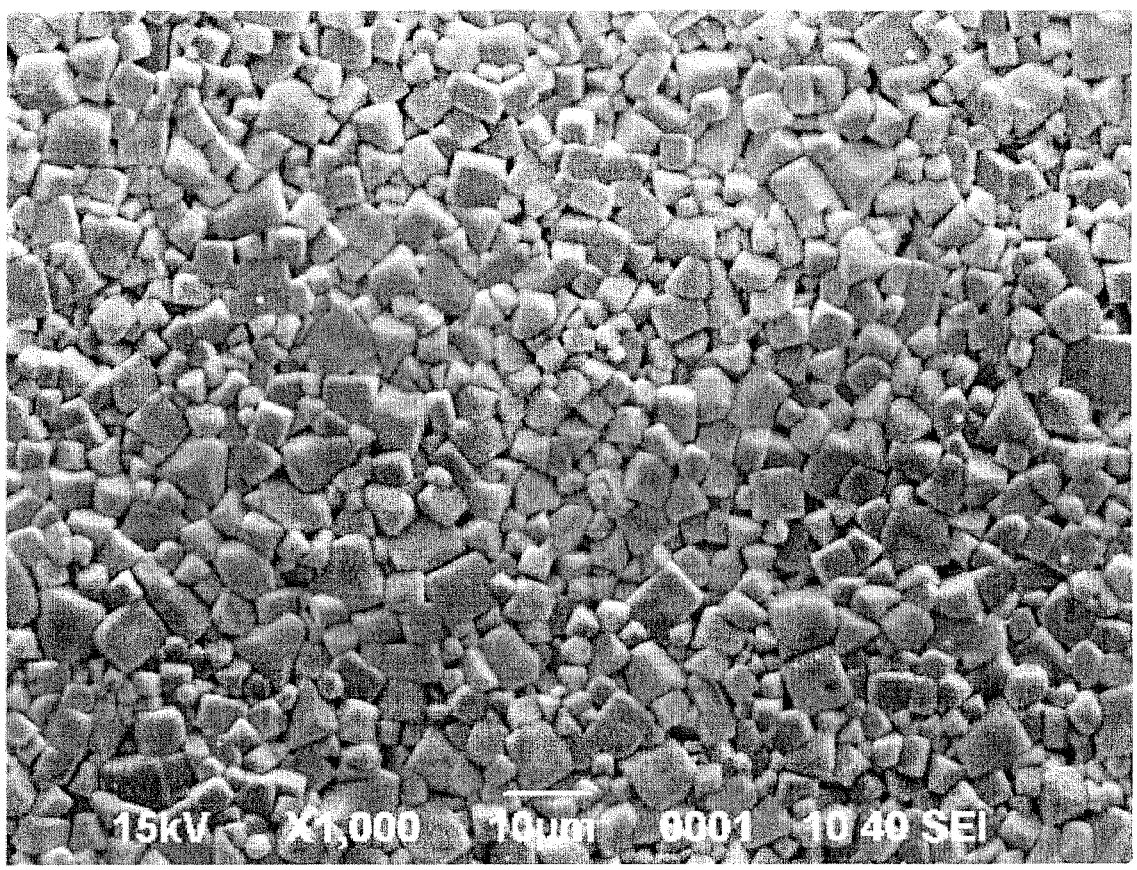
FIG. 2 is an SEM photograph showing a surface microstructure of a sintered body obtained in Example 7.

After the pellet-like sample described in Comparative Example 1 was heated in a furnace at a heating rate of 200° C./h to 900° C. in the air and retained at 900° C. for 10 hours, the temperature was raised at a heating rate of 200° C./h to a firing temperature of 1050° C. After retaining the temperature at 1050° C. for 3 hours, the sample was cooled in the furnace. The surface microstructure of the resultant sintered body shows that grain diameters fluctuate little and are uniform compared with Comparative Example 1 (see an SEM photograph of FIG. 2). Properties of the resultant sintered body were evaluated in the same manner as in Comparative Example 1. The results are shown in Tables 2 and 4.

Example 8

After the pellet-like sample described in Comparative Example 1 was heated in a furnace at a heating rate of 200° C./h to 900° C. in the air and retained at 900° C. for 20 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 2.

Comparative Example 3

The pellet-like sample described in Comparative Example 1 was heated at a heating rate of 200° C./h to a firing temperature of 1050° C. in a flow of oxygen by use of a tubular furnace. After retaining the temperature at 1050° C. for 3 hours, the sample was cooled in the tubular furnace. Properties of the resultant sintered body were evaluated in the same manner as in Comparative Example 1. The results are shown in Table 3.

Example 9

After the pellet-like sample described in Comparative Example 1 was heated at a heating rate of 200° C./h to 900° C. in a flow of oxygen by use of a tubular furnace, and retained at 900° C. for 3 hours, the temperature was raised at a heating rate of 200° C./h to a firing temperature of 1050° C. After retaining the temperature at 1050° C. for 3 hours, the sample was cooled in the tubular furnace. Properties of the resultant sintered body were evaluated in the same manner as in Comparative Example 1. The results are shown in Table 3.

Example 10

After the pellet-like sample described in Comparative Example 1 was heated at a heating rate of 200° C./h to 900° C. in a flow of oxygen by use of a tubular furnace, and retained at 900° C. for 6 hours, the temperature was raised at a heating rate of 200° C./h to a firing temperature of 1050° C. After retaining the temperature at 1050° C. for 3 hours, the sample was cooled in the tubular furnace. Properties of the resultant sintered body were evaluated in the same manner as in Comparative Example 1. The results are shown in Table 3.

Example 11

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=0.85) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 12

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=0.90) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 13

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=0.95) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 14

Calcined/crushed powder (grain diameters of 0.2 to 0.5 μm, a grain shape was spherical) having a composition Of $\{Li_y(Na_{1-x}K_x)_{1-y}\}_a(Nb_{1-z}Ta_z)O_3$ (x=0.458, y=0.057, z=0.082, a=1.00) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 15

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=1.005) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 16

Calcined/crushed powder (grain diameters of 0.2 to 0.5 μm, a grain shape was spherical) having a composition Of $\{Li_y(Na_{1-x}K_x)_{1-y}\}_a(Nb_{1-z}Ta_z)O_3$ (x=0.458, y=0.057, z=0.082, a=1.10) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 17

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=1.15) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 18

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=1.20) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

Example 19

Calcined/crushed powder (grain diameters of 0.2 to 0.5 μm, a grain shape was spherical) having a composition of $\{Li_y(Na_{1-x}K_x)_{1-y}\}_a(Nb_{1-z}Ta_z)O_3$ (x=0.458, y=0.057, z=0.082, a=1.25) was formed into pellets (a pellet-like sample). After this pellet-like sample was heated in a furnace at a heating rate of 200° C./h to 900° C. in the air, and retained at 900° C. for 10 hours, the temperature was raised at a heating rate of 200° C./h to a firing temperature of 1050° C. After retaining the temperature at 1050° C. for 3 hours, the sample was cooled in the furnace. Properties of the resultant sintered body were evaluated in the same manner as in Comparative Example 1. The results are shown in Table 4.

TABLE 1

(Holding temperature dependence: atmosphere is the air. A holding time is three hours. A relative density is calculated assuming that the true density is 4.7 g/cm$^3$.)

| | Comparative Example 1 | Comparative Example 2 | Example 1 | Example 2 | Example 3 | Example 4 |
|---|---|---|---|---|---|---|
| Keeping temperature | Not kept | 800° C. | 850° C. | 900° C. | 950° C. | 1000° C. |
| Relative density | 93.7% | 93.9% | 94.1% | 95.4% | 94.1% | 94.2% |
| Relative Dielectric constant | 753 | 761 | 790 | 815 | 788 | 785 |
| d31 | 37 pm/V | 40 pm/V | 44 pm/V | 39 pm/V | 40 pm/V | 41 pm/V |
| tanδ | 1.50% | 2.96% | 1.95% | 1.83% | 1.89% | 2.83% |
| S4000 | 410 ppm | 406 ppm | 457 ppm | 441 ppm | 432 ppm | 419 ppm |

TABLE 2

(Holding time dependence: atmosphere is the air. A holding temperature is 900° C. A relative density is calculated assuming that the true density is 4.7 g/cm$^3$.)

| | Comparative Example 1 | Example 5 | Example 2 | Example 6 | Example 7 | Example 8 |
|---|---|---|---|---|---|---|
| Keeping time | Not kept | 1 hour | 3 hours | 6 hours | 10 hours | 20 hours |
| Relative density | 93.7% | 94.8% | 95.4% | 96.0% | 96.3% | 96.0% |
| Relative Dielectric constant | 753 | 785 | 815 | 815 | 823 | 815 |
| d31 | 37 pm/V | 33 pm/V | 39 pm/V | 33 pm/V | 34 pm/V | 33 pm/V |
| tanδ | 1.50% | 2.13% | 1.83% | 2.14% | 2.41% | 1.65% |
| S4000 | 410 ppm | 430 ppm | 441 ppm | 443 ppm | 464 ppm | 445 ppm |

TABLE 4

(A/B ratio dependence: atmosphere is the air. A holding temperature is 900° C., and a holding time is 10 hours. A relative density is calculated assuming that the true density is 4.7 g/cm$^3$.)

| | Example 11 | Example 12 | Example 13 | Example 14 | Example 15 | Example 7 | Example 16 | Example 17 | Example 18 | Example 19 |
|---|---|---|---|---|---|---|---|---|---|---|
| A/B ratio | 0.85 | 0.90 | 0.95 | 1.00 | 1.005 | 1.01 | 1.10 | 1.15 | 1.20 | 1.25 |
| Relative density | 93.9% | 94.9% | 95.0% | 95.3% | 96.0% | 96.3% | 96.0% | 95.4% | 94.8% | 94.7% |
| tanδ | 2.17% | 2.01% | 1.82% | 1.95% | 1.54% | 2.41% | 2.32% | 2.40% | 2.42% | 3.50% |
| S4000 | 421 ppm | 432 ppm | 433 ppm | 438 ppm | 455 ppm | 464 ppm | 460 ppm | 440 ppm | 431 ppm | 420 ppm |

TABLE 3

(Holding time dependence: atmosphere is a flow of oxygen. A holding temperature is 900° C. A relative density is calculated assuming that the true density is 4.7 g/cm$^3$.)

| | Comparative Example 3 | Example 9 | Example 10 |
|---|---|---|---|
| Keeping time | Not kept | 3 hours | 6 hours |
| Relative density | 96.1% | 98.4% | 99.0% |
| Relative Dielectric constant | 866 | 904 | 944 |
| d31 | 48 pm/V | 50 pm/V | 52 pm/V |
| tanδ | 3.77% | 3.58% | 4.23% |
| S4000 | 435 ppm | 451 ppm | 470 ppm |

As seen from the above results, by inserting a keeping process of a firing schedule in a temperature range in which a firing contraction occurred, the relative dielectric constant and the electric-field-induced strain (S4000) also improved other than the density. Especially, it is seen that holding the temperature at a limit temperature at which the grain growth does not occur or a temperature at which a slight other phase can exist (850 to 950° C. in the composition of this example) is the most effective for improving the electric-field-induced strain.

Moreover, when the holding process is included in the firing schedule, fluctuations of crystal grains of the sintered body are effectively reduced, and therefore the electric-field-induced strain is improved. This effect becomes further remarkable, when the keeping time is lengthened. The reduction of the fluctuations of the grain diameters also results in improvement of a mechanical property.

According to the present invention, an excellent (Li, Na, K)(Nb, Ta)$O_3$ type piezoelectric material in which a relative dielectric constant and an electric-field-induced strain have been improved can be produced, and hence the present invention is preferably applicable to an actuator, a sensor and the like.

What is claimed is:

1. A method for manufacturing a sintered piezoelectric body comprising the steps of:
    forming a piezoelectric body from a piezoelectric material comprising calcined powder particles having an $ABO_3$ piezoelectric composition, wherein A comprises Li, Na and K and wherein B comprises Nb and Ta;
    performing a first heating step of heating the piezoelectric body to a predetermined constant holding temperature, which is a temperature immediately before grain growth of the powder particles occurs, in a range of 850 to 1000° C., and holding the piezoelectric body at the predetermined constant holding temperature for a predetermined holding time in a range of 1 to 20 hours; and
    performing a second heating step, immediately after completion of the predetermined holding time of the first heating step, of sintering the piezoelectric body by raising the temperature from the predetermined constant holding temperature of the first step to a sintering temperature, and holding the sintering temperature for a predetermined time to form the sintered piezoelectric body.

2. The method for manufacturing according to claim 1, wherein the predetermined constant holding temperature is in a range of 850 to 950° C.

3. The method for manufacturing according to claim 1, wherein a heating atmosphere is an oxygen atmosphere.

4. The method for manufacturing according to claim 2, wherein a heating atmosphere is an oxygen atmosphere.

5. The method according to claim 1, wherein the predetermined constant holding temperature is in a range of 850 to 900° C.

6. The method according to claim 1, wherein the predetermined holding time of the first heating step is in a range of 6-20 hours.

7. The method according to claim 1, wherein sintering does not occur during the first heating step.

* * * * *